US009209266B2

(12) United States Patent
Lim et al.

(10) Patent No.: US 9,209,266 B2
(45) Date of Patent: *Dec. 8, 2015

(54) HIGH ELECTRON MOBILITY TRANSISTOR AND MANUFACTURING METHOD THEREOF

(71) Applicant: ELECTRONICS AND TELECOMMUNICATIONS RESEARCH INSTITUTE, Daejeon (KR)

(72) Inventors: Jong-Won Lim, Daejeon (KR); Ho Kyun Ahn, Daejeon (KR); Young Rak Park, Daejeon (KR); Dong Min Kang, Daejeon (KR); Woo Jin Chang, Daejeon (KR); Seong-il Kim, Daejeon (KR); Sung Bum Bae, Daejeon (KR); Sang-Heung Lee, Daejeon (KR); Hyung Sup Yoon, Daejeon (KR); Chull Won Ju, Daejeon (KR); Jae Kyoung Mun, Daejeon (KR); Eun Soo Nam, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/555,182

(22) Filed: Nov. 26, 2014

(65) Prior Publication Data

US 2015/0087142 A1 Mar. 26, 2015

Related U.S. Application Data

(62) Division of application No. 13/651,638, filed on Oct. 15, 2012, now abandoned.

(30) Foreign Application Priority Data

Jan. 19, 2012 (KR) .................. 10-2012-0006224

(51) Int. Cl.
*H01L 21/265* (2006.01)

*H01L 21/336* (2006.01)
(Continued)

(52) U.S. Cl.
CPC .... *H01L 29/66431* (2013.01); *H01L 21/28255* (2013.01); *H01L 21/31116* (2013.01);
(Continued)

(58) Field of Classification Search
CPC ...... H01L 21/265; H01L 21/336; H01L 21/28
See application file for complete search history.

(56) References Cited

U.S. PATENT DOCUMENTS

| 5,288,654 A | 2/1994 | Kasai et al. |
| 6,140,169 A | 10/2000 | Kawai et al. |

(Continued)

FOREIGN PATENT DOCUMENTS

| JP | 06-209018 A | 7/1994 |
| KR | 10-1998-0073049 | 11/1998 |

(Continued)

*Primary Examiner* — David Vu
*Assistant Examiner* — Mouloucoulaye Inoussa
(74) *Attorney, Agent, or Firm* — Rabin & Berdo, P.C.

(57) ABSTRACT

Disclosed is a manufacturing method of a high electron mobility transistor. The method includes: forming a source electrode and a drain electrode on a substrate; forming a first insulating film having a first opening on an entire surface of the substrate, the first opening exposing a part of the substrate; forming a second insulating film having a second opening within the first opening, the second opening exposing a part of the substrate; forming a third insulating film having a third opening within the second opening, the third opening exposing a part of the substrate; etching a part of the first insulating film, the second insulating film and the third insulating film so as to expose the source electrode and the drain electrode; and forming a T-gate electrode on a support structure including the first insulating film, the second insulating film and the third insulating film.

9 Claims, 5 Drawing Sheets

(51) Int. Cl.
*H01L 21/28* (2006.01)
*H01L 29/66* (2006.01)
*H01L 29/423* (2006.01)
*H01L 29/778* (2006.01)
*H01L 29/16* (2006.01)
*H01L 21/311* (2006.01)

(52) U.S. Cl.
CPC ...... *H01L21/31144* (2013.01); *H01L 29/1608* (2013.01); *H01L 29/42316* (2013.01); *H01L 29/42376* (2013.01); *H01L 29/66068* (2013.01); *H01L 29/7787* (2013.01)

(56) References Cited

U.S. PATENT DOCUMENTS 6,387,783 B1 5/2002 Furukawa et al.
8,901,608 B2 * 12/2014 Lim et al. ............ 257/194

FOREIGN PATENT DOCUMENTS

| KR | 10-2001-0063506 A | 7/2001 |
| KR | 10-2002-0015975 A | 3/2002 |
| KR | 10-0922575 B1 | 10/2009 |

* cited by examiner

<PRIOR ART>

HIGH ELECTRON MOBILITY TRANSISTOR AND MANUFACTURING METHOD THEREOF

CROSS-REFERENCE TO RELATED APPLICATIONS

This is a division of application Ser. No. 13/651,638, filed Oct. 15, 2012. Furthermore, this application claims priority from Korean Patent Application No. 10-2012-0006224, filed on Jan. 19, 2012, with the Korean Intellectual Property Office, the disclosure of which is incorporated herein in its entirety by reference.

TECHNICAL FIELD

The present disclosure relates to a method of manufacturing a semiconductor device. More particularly, the present disclosure relates to a high electron mobility transistor having a T-gate electrode structure using an insulating film of a hetero-junction semiconductor device, and a manufacturing method of the same.

BACKGROUND

In general, in a high electron mobility transistor (HEMT), that is, a compound semiconductor device, one or more layers included within the device have very different lattice constants from those of other materials within the device. Due to such a lattice mismatch, the structure of a material forming a channel layer is deformed. In the HEMT, stress distortion caused by such a lattice mismatch improves electron mobility in the channel layer, thereby improving the operation speed of the device.

The HEMT has a difficulty in substrate growth, but has an increase in the density of charges transferred to the channel layer, and a high electron mobility. In other words, the HEMT has a higher power and an improved noise characteristic. Accordingly, the HEMT can be operated in a high frequency. Further, the HEMT is more excellent in an electron speed characteristic than an electronic device using silicon, and thus is widely applied to microwave or millimeter wave band devices. Especially, since the HEMT has advantages such as a low super-high frequency noise characteristic, the HEMT is an important device used to develop millimeter-wave band circuits and components with high-performance for wireless communications.

Meanwhile, in a high-speed device, a gate length has to be decreased to achieve a high modulation operation, and further, it is required to improve a noise characteristic by reducing a gate resistance. Thus, a T-gate or mushroom-gate having a wide cross-sectional area is essentially used.

The T-gate or mushroom-gate is generally formed through an electron beam lithography method or a photolithography method. However, since in the photolithography method, the resolution was insufficient to form a fine line width of a gate electrode, the electron beam lithography method has been conventionally used to form a T-gate electrode. In the electron beam lithography method, a double-layered or triple-layered photosensitive film is generally used.

FIG. 1 is a cross-sectional view illustrating the configuration of a transistor having a conventional a T-gate electrode structure.

As shown in FIG. 1, on a substrate 103, a source electrode 109a and a drain electrode 109b are in ohmic contact with each other, and an insulating film 111 and a gate electrode 113 are formed.

However, in the transistor having a conventional T-gate electrode structure, the width of a gate length may be increased due to wet etching, and a high frequency characteristic may be deteriorated due to an increase of gate-source and gate-drain capacitance.

Further, in the transistor having the conventional T-gate electrode structure, since wet etching is performed by using an etch stopping layer 105, it is required to accurately adjust an etching rate. Since an undercut may be formed due to an etching characteristic in which the wet-etching is performed in lateral directions not only in a depth direction, source resistance may increase and a gate length may be changed. This may have an influence on the improvement in performance of a device.

SUMMARY

The present disclosure has been made in an effort to solve the above described problems, and provides a high electron mobility transistor for improving the stability of a gate electrode, and protecting an active area.

Another object of the present disclosure is to provide a high electron mobility transistor for reducing a parasitic capacitance.

A further object of the present disclosure is to provide a high electron mobility transistor for reducing a gate resistance.

A still further object of the present disclosure is to provide a method of manufacturing a high electron mobility transistor, wherein in the high electron mobility transistor, a fine line width of a gate is maintained, a source resistance is reduced, and a gate-source capacitance and a gate-drain capacitance are reduced so as to improve a high frequency characteristic.

An exemplary embodiment of the present disclosure provides a high electron mobility transistor including: a substrate; a source electrode and a drain electrode formed on the substrate; a insulating film formed between the source electrode and the drain electrode, which has an opening therein; and a T-gate electrode formed on a top of the insulating film.

Another exemplary embodiment of the present disclosure provides a method of manufacturing a high electron mobility transistor, the method including: forming a source electrode and a drain electrode on a substrate; forming a first insulating film having a first opening on an entire surface of the substrate, the first opening exposing a part of the substrate; forming a second insulating film having a second opening within the first opening, the second opening exposing a part of the substrate; forming a third insulating film having a third opening within the second opening, the third opening exposing a part of the substrate; etching a part of the first insulating film, the second insulating film and the third insulating film so as to expose the source electrode and the drain electrode; and forming a T-gate electrode on a support structure including the first insulating film, the second insulating film and the third insulating film.

As described above, the inventive high electron mobility transistor including an insulating film with a line width has an effect in improving the stability of a T-gate electrode.

Also, since the high electron mobility transistor has a structure wherein the insulating film remains under a head portion of the T-gate electrode, it is possible to improve the output characteristic of a drain electrode.

Also, in the method of manufacturing the high electron mobility transistor, a dry etching method is used for etching a gate recess. Thus, it is possible to maintain the fine line width of the T-gate electrode, to reduce the gate-source capacitance and the gate-drain capacitance, and to improve a cut-off frequency and a high frequency characteristic due to reduction of a gate length.

Also, in the method of manufacturing the high electron mobility transistor, a double-layered or triple-layered electron beam resist is not used. Thus, it is possible to reduce a time and a cost for the manufacturing process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. In a description of the present disclosure, a detailed description of related known configurations and functions will be omitted when it may make the essence of the present disclosure obscure.

Figure 1:
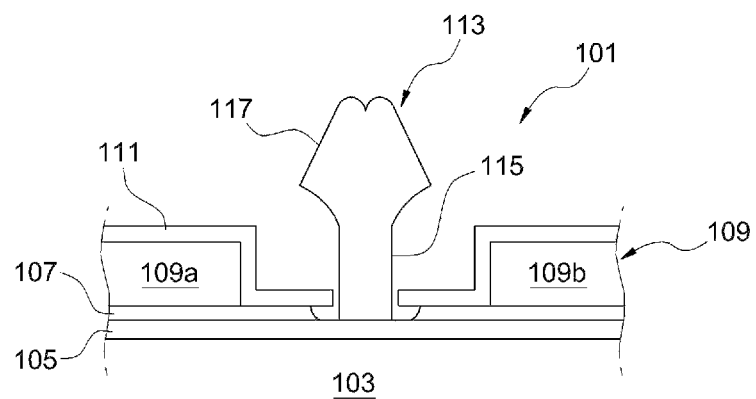
FIG. 1 is a cross-sectional view illustrating the configuration of a transistor having a conventional T-gate electrode structure.
Figure 2:
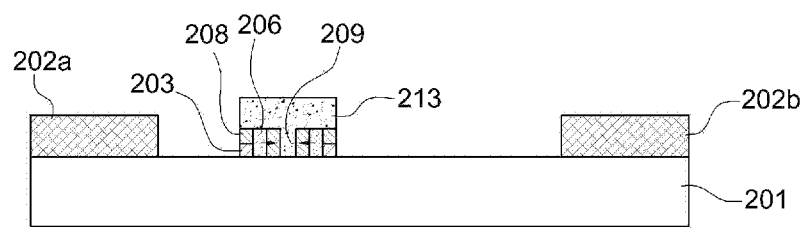
FIG. 2 is a cross-sectional view illustrating the configuration of a high electron mobility transistor according to one embodiment of the present disclosure.

FIG. 2 is a cross-sectional view illustrating the configuration of a high electron mobility transistor according to one embodiment of the present disclosure.

Referring to FIG. 2, the inventive high electron mobility transistor includes a substrate 201, a source electrode 202a, a drain electrode 202b, insulating films 203, 206, and 208 and a T-gate electrode 213.

The substrate 201 may be a highly resistant silicon substrate, a silicon carbide (SiC) substrate, a sapphire substrate or the like having an epitaxially grown layer.

The source electrode 202a is formed on one side of the top of the substrate 201, and the drain electrode 202b is formed on the other side of the top of the substrate 201. Herein, the source electrode 202a and the drain electrode 202b may be made of a conductive metal such as Ti/Al/Ni/Au.

The insulating films 203, 206, and 208 are formed between the source electrode 202a and the drain electrode 202b, and have an opening 209 with a fine line width of 0.1 to 0.3 μm. Herein, the insulating films 203, 206, and 208 may include a silicon nitride film or a silicon oxide film.

The T-gate electrode 213 is formed on the top of the insulating films 203, 206, and 208. Specifically, the head portion of the T-gate electrode 213 is supported by the insulating films 203, 206, and 208, and the body portion of the T-gate electrode 213 formed in the opening 209 of the insulating films 203, 206, and 208.

Figure 3A:
FIGS. 3A to 3P show a process flow of a method of manufacturing the high electron mobility transistor according to one embodiment of the present disclosure.
Figure 3B:
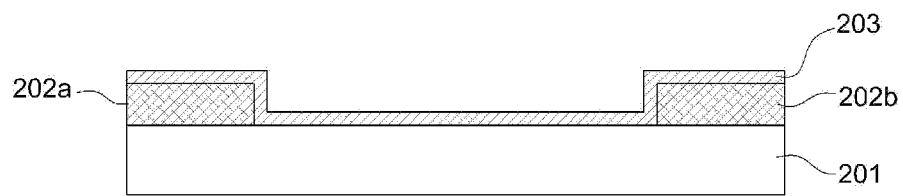
Figure 3C:
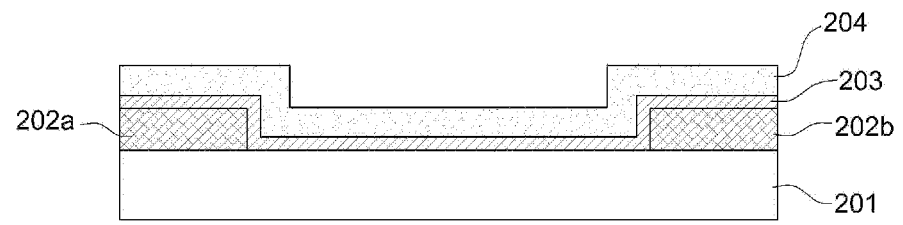
Figure 3D:
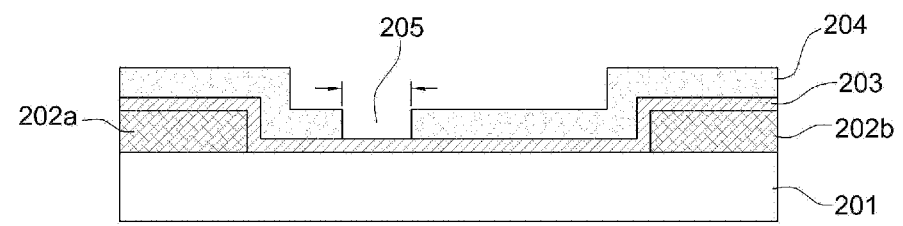
Figure 3E:
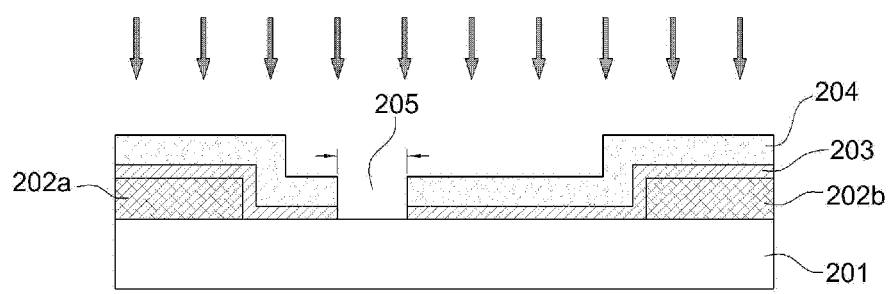
Figure 3F:
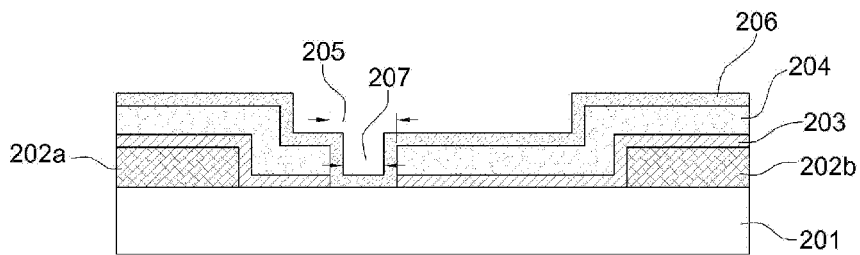
Figure 3G:
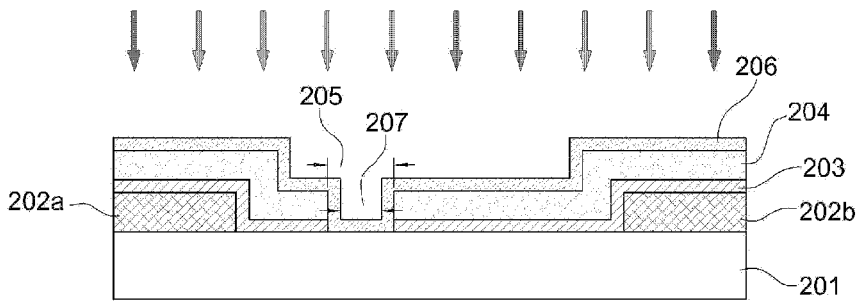
Figure 3H:
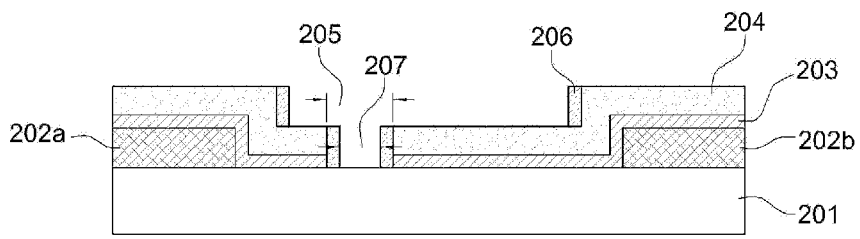
Figure 3I:
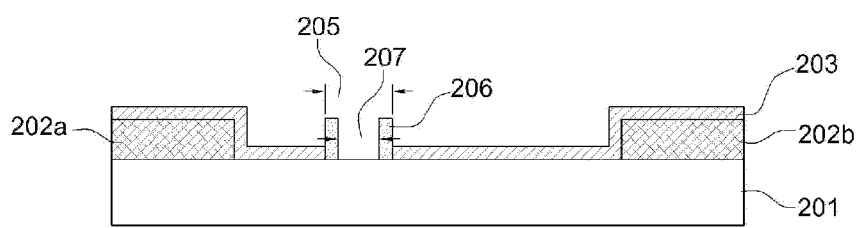
Figure 3J:
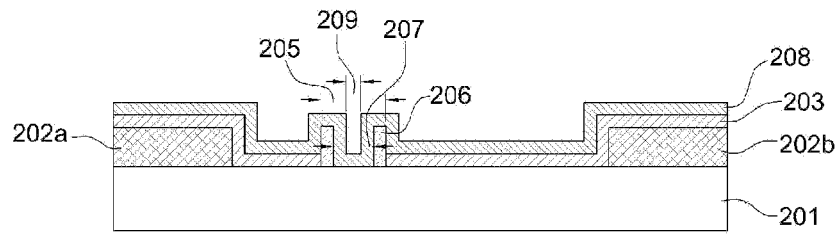
Figure 3K:
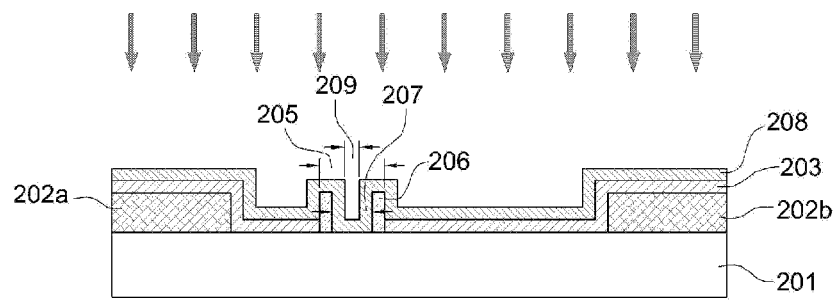
Figure 3L:
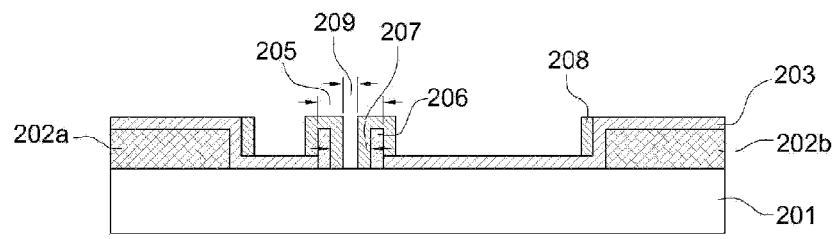
Figure 3M:
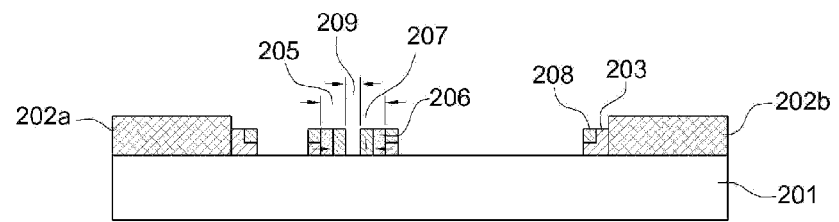
Figure 3N:
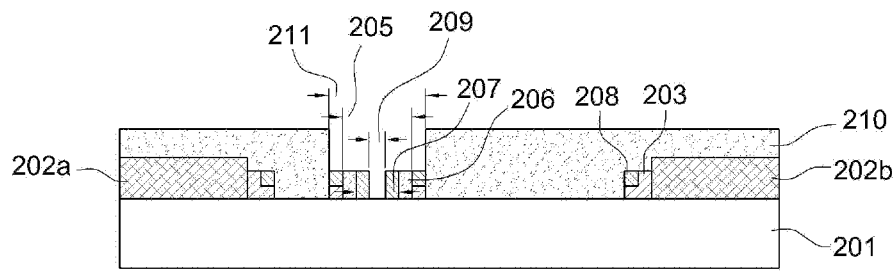
Figure 3O:
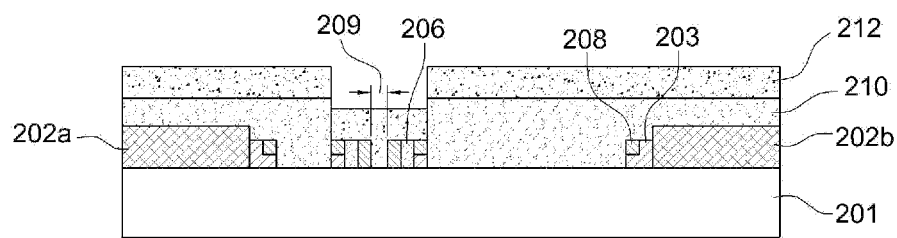
Figure 3P:
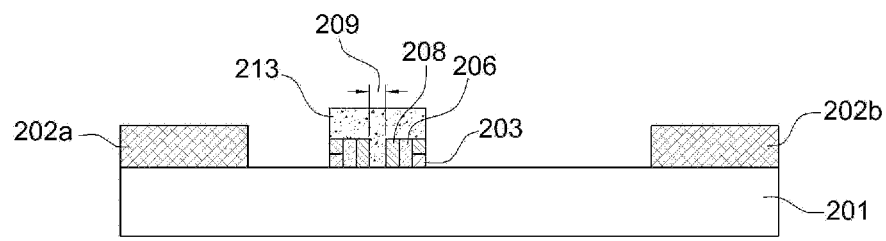

FIGS. 3A to 3P show a process flow of a method of manufacturing the high electron mobility transistor according to one embodiment of the present disclosure.

Referring to FIG. 3A, on the substrate 201, the source electrode 202a and the drain electrode 202b are formed. Herein, the substrate 201 is an insulating substrate, which may be a highly resistant silicon substrate, a silicon carbide (SiC) substrate, a sapphire substrate or the like, having an epitaxially grown layer.

Also, the source electrode 202a and the drain electrode 202b may be made of an alloy of conductive metals (e.g., Ti/Al/Ni/Au, etc.) through a rapid thermal processing method.

Referring to FIG. 3B, after the source electrode 202a and the drain electrode 202b are formed, a first insulating film 203 is formed on the entire surface of the substrate 201. Herein, the first insulating film 203 may be deposited through a plasma enhanced chemical vapor deposition (PECVD) method or a sputtering method. Herein, the first insulating film 203 may be realized in a silicon nitride film or a silicon oxide film. Also, the insulating film 203 is preferably formed with a thickness of about 1500 to 2000 in order to support the T-gate electrode 213 (to be described later) and at the same time to protect the active area of a device.

Referring to FIG. 3C, on the insulating film 203, a photosensitive film (polymethyl methacrylate: PMMA) 204 of a single layer is coated. Herein, the photosensitive film 204 is subjected to a baking process at 190° C. for 2 minutes. At this time, the photosensitive film 204 has a thickness of about 2500 to 3500 Å.

Referring to FIG. 3D, the photosensitive film 204 is subjected to an exposure process with a line width of 0.5 to 0.7 μm by using a mask pattern, and subjected to a developing process so that the first insulating film 203 can be exposed through the first opening 205 with a line width of 0.5 to 0.7 μm. Herein, a plasma ashing process is performed so that the photosensitive film 204 cannot remain.

Referring to FIG. 3E, through a dry etching method using reactive ion etching (RIE), the exposed first insulating film 203 is anisotropically etched so as to expose the substrate 201. Accordingly, the substrate 201 is exposed through the first opening 205 with a line width of 0.5 to 0.7 μm. Herein, the first insulating film 203 is preferably over-etched so as to not remain on the substrate 201.

Referring to FIG. 3F, on the entire surface of the substrate 201, a second insulating film 206 is formed with a thickness of 1000 Å through a plasma enhanced chemical vapor deposition (PECVD) method or a sputtering method. Accordingly, naturally, on the second insulating film 206, a second opening 207 with a line width of 0.3 to 0.5 μm is formed. Herein, the second insulating film 206 may be realized in a silicon nitride film or a silicon oxide film.

Referring to FIG. 3G, through a dry etching method using reactive ion etching (RIE), the exposed second insulating film 206 is anisotropically etched.

Referring to FIG. 3H, through a dry etching method using reactive ion etching (RIE) the exposed second insulating film 206 is continuously anisotropically etched so as to expose the substrate 201. Accordingly, the substrate 201 is exposed through the second opening 207 with a line width of 0.3 to 0.5 μm.

Referring to FIG. 3I, through a lift-off process using acetone, the photosensitive film 204 and the second insulating film 206 formed on the top of the photosensitive film 204 are removed.

Referring to FIG. 3J, on the entire surface of the substrate 201, a third insulating film 208 is formed with a thickness of 1000 Å through a plasma enhanced chemical vapor deposition (PECVD) method or a sputtering method. Accordingly, naturally, on the third insulating film 208, a third opening 209 with a fine line width of 0.1 to 0.3 μm is formed. Herein, the third insulating film 208 may be realized in a silicon nitride film or a silicon oxide film.

Referring to FIG. 3K, through a dry etching method using reactive ion etching (RIE), the exposed third insulating film 208 is anisotropically etched.

Referring to FIG. 3L, through a dry etching method using reactive ion etching (RIE) the exposed third insulating film 208 is continuously anisotropically etched so as to expose the substrate 201. Accordingly, the substrate 201 is exposed through the third opening 209 with a fine line width of 0.1 to 0.3 μm.

Referring to FIG. 3M, through a dry etching method using reactive ion etching, the exposed first insulating film 203, the exposed second insulating film 206 and the exposed third insulating film 208 are anisotropically etched so as to expose the source electrode 202a and the drain electrode 202b.

Referring to FIG. 3N, on the entire surface of the substrate 201, a photosensitive film 210 of a single layer is coated. Herein, the photosensitive film 210 is subjected to a baking process, and subjected to an exposure process with a line width of 1.0 to 1.2 μm by using a mask pattern. Herein, as the exposure light source, UV (I-line, 365 nm) is used.

Then, through a dry etching method using inductively coupled plasma, the photosensitive film 210 is recess-etched so as to form a fourth opening 211 with a line width of 1.0 to 1.2 μm. Herein, as gas, $BCl_3/Cl_2$ is used. The current between the source electrode 202a and the drain electrode 202b is adjusted while the photosensitive film 210 is selectively recess-etched.

Referring to FIG. 3O, on the entire surface of the substrate 201, a gate electrode metal 212, including Ni/Au, is deposited through electron beam vacuum deposition. Herein, the total thickness of the gate electrode metal 212 ranges from 2500 to 3000 Å.

Referring to FIG. 3P, through a lift-off process, the photosensitive film 210 and the gate electrode metal 212 formed on the top of the photosensitive film 210 are removed. Then, the T-gate electrode 213 is formed, thereby providing a high electron mobility transistor. Herein, the insulating film remaining on the substrate 201 can be also removed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a high electron mobility transistor, the method comprising:
   forming a source electrode and a drain electrode on a substrate;
   forming a first insulating film having a first opening on an entire surface of the substrate, the first opening exposing a part of the substrate;
   forming a second insulating film having a second opening within the first opening, the second opening exposing a part of the substrate;
   forming a third insulating film having a third opening within the second opening, the third opening exposing a part of the substrate;
   etching a part of the first insulating film, the second insulating film and the third insulating film so as to expose the source electrode and the drain electrode; and
   forming a T-gate electrode on a support structure comprising the first insulating film, the second insulating film and the third insulating film.

2. The method of claim 1, wherein the forming the first insulating film having the first opening comprises:
   forming the first insulating film on the entire surface of the substrate;
   forming a photosensitive film on the first insulating film;
   subjecting the photosensitive film to an exposure process and a developing process to form a photosensitive film pattern for exposing a part of the first insulating film by a line width of the first opening; and
   etching the part of the first insulating film by using the photosensitive film pattern as a mask.

3. The method of claim 2, wherein in the etching the part of the first insulating film, the part of the first insulating film is etched through reactive ion etching.

4. The method of claim 1, wherein the forming the second insulating film having the second opening comprises:
   forming the second insulating film on the entire surface of the substrate;
   exposing the part of the substrate by a line width of the second opening by etching a part of the second insulating film; and
   removing a photosensitive film pattern and the second insulating film on the photosensitive film pattern.

5. The method of claim 4, wherein in the exposing the part of the substrate by the line width of the second opening, the part of the second insulating film is etched through reactive ion etching.

6. The method of claim 4, wherein in the removing the second insulating film on the photosensitive film pattern, the photosensitive film pattern and the second insulating film on the photosensitive film pattern are removed through a lift-off process using acetone.

7. The method of claim 1, wherein the forming the third insulating film having the third opening comprises:
   forming the third insulating film on the entire surface of the substrate; and
   exposing the part of the substrate by a line width of the third opening by etching a part of the third insulating film.

8. The method of claim 7, wherein in the exposing the part of the substrate by the line width of the third opening, the part of the third insulating film is etched through reactive ion etching.

9. The method of claim 1, wherein the forming the T-gate electrode comprises:
   forming an image reversal photosensitive film for exposing the support structure; and
   depositing a gate electrode metal on the entire surface of the substrate and performing a lift-off process so as to form the T-gate electrode.

* * * * *